United States Patent
Chew et al.

(10) Patent No.: US 8,668,833 B2
(45) Date of Patent: Mar. 11, 2014

(54) METHOD OF FORMING A NANOSTRUCTURE

(75) Inventors: Han Guan Chew, Singapore (SG); Fei Zheng, Singapore (SG); Wee Kiong Choi, Singapore (SG); Tze Haw Liew, Singapore (SG)

(73) Assignees: GLOBALFOUNDRIES Singapore Pte. Ltd., Singapore (SG); National University of Singapore, Singapore (SG)

( * ) Notice: Subject to any disclaimer, the term of this patent is extended or adjusted under 35 U.S.C. 154(b) by 1190 days.

(21) Appl. No.: 12/125,030

(22) Filed: May 21, 2008

(65) Prior Publication Data

US 2009/0291311 A1    Nov. 26, 2009

(51) Int. Cl.
*B32B 33/00* (2006.01)
*B44C 1/22* (2006.01)
*H01L 21/311* (2006.01)

(52) U.S. Cl.
USPC ...... 216/2; 216/17; 216/39; 216/41; 428/409; 257/E21.214; 438/700

(58) Field of Classification Search
None
See application file for complete search history.

(56) References Cited

U.S. PATENT DOCUMENTS

| | | | | |
|---|---|---|---|---|
| 6,274,007 | B1 * | 8/2001 | Smirnov et al. | 204/192.13 |
| 6,515,339 | B2 * | 2/2003 | Shin et al. | 257/368 |
| 6,565,763 | B1 * | 5/2003 | Asakawa et al. | 216/56 |
| 7,158,219 | B2 * | 1/2007 | Li et al. | 356/36 |
| 7,276,172 | B2 * | 10/2007 | Wessels et al. | 216/2 |
| 7,718,531 | B2 * | 5/2010 | Radisic et al. | 438/678 |
| 7,829,443 | B2 * | 11/2010 | Seifert et al. | 438/478 |
| 2003/0102263 | A1 * | 6/2003 | Lopez et al. | 210/639 |
| 2005/0112052 | A1 * | 5/2005 | Gu et al. | 423/447.1 |
| 2005/0215049 | A1 * | 9/2005 | Horibe et al. | 438/622 |
| 2006/0054881 | A1 * | 3/2006 | Li et al. | 257/19 |
| 2006/0146323 | A1 * | 7/2006 | Bratkovski et al. | 356/301 |
| 2006/0258132 | A1 * | 11/2006 | Brown et al. | 438/610 |
| 2006/0290003 | A1 * | 12/2006 | Kawabata et al. | 257/774 |
| 2007/0252132 | A1 * | 11/2007 | Kamins et al. | 257/13 |
| 2008/0246123 | A1 * | 10/2008 | Kamins | 257/623 |
| 2009/0050204 | A1 * | 2/2009 | Habib | 136/261 |
| 2009/0059982 | A1 * | 3/2009 | Kamins et al. | 372/43.01 |
| 2009/0072222 | A1 * | 3/2009 | Radisic et al. | 257/24 |
| 2009/0131245 | A1 * | 5/2009 | Esconjauregui et al. | 502/100 |
| 2009/0291311 | A1 * | 11/2009 | Chew et al. | 428/409 |
| 2011/0076827 | A1 * | 3/2011 | Liu et al. | 438/382 |

FOREIGN PATENT DOCUMENTS

| | | |
|---|---|---|
| CN | 1884042 | 12/2006 |
| WO | 2004087564 | 10/2004 |
| WO | 2005022565 | 3/2005 |

* cited by examiner

*Primary Examiner* — Allan Olsen
(74) *Attorney, Agent, or Firm* — Horizon IP Pte. Ltd.

(57) ABSTRACT

A method of forming a discrete nanostructured element at one or more predetermined locations on a substrate is presented. The method includes forming a mask member over the substrate. A window is formed in the mask member at each of one or more locations at which it is required to form the nanostructured element thereby to expose a portion of a surface of the substrate. A portion of the substrate exposed by the window at the one or more locations is removed to form one or more recesses in the substrate. The method further includes forming a layer of a nanostructure medium over a surface of the recess and annealing the structure thereby to form the nanostructured element in each of the one or more recesses. The nanostructured element includes a portion of the nanostructure medium and has an external dimension along at least two substantially orthogonal directions of less than substantially 100 nm.

24 Claims, 11 Drawing Sheets

METHOD OF FORMING A NANOSTRUCTURE

FIELD OF THE INVENTION

The present invention relates to a method of forming nanostructures.

DESCRIPTION OF THE RELATED ART

Nanostructures such as nanoparticles and nanowires may be formed on a substrate by, for example, first forming them in an environment away from a surface of a substrate and subsequently depositing them on the substrate as discrete entities. Alternatively, nanostructures may be nucleated and grown directly on a substrate. Nanoparticles and nanowires may for example be nucleated on a surface directly from a vapour of material.

However, conventional processes are unable to form or have difficulty in forming nanoparticles or nanowires at predetermined locations or forming ordered arrays of nanoparticles or nanowires.

SUMMARY OF THE INVENTION

It is an object of the present invention to at least partly mitigate at least one of the above-mentioned problems.

It is a further object of embodiments of the invention to provide a method of forming a nanoparticle at a predetermined location on a structure.

In a first aspect of the invention there is provided a method of forming a discrete nanostructured element at one or more predetermined locations on a substrate comprising the steps of: forming a mask member over said substrate; forming a window in said mask member at each of one or more locations at which it is required to form said nanostructured element thereby to expose a portion of a surface of said substrate; removing a portion of said substrate exposed by said window at said one or more locations to form one or more recesses in said substrate; forming a layer of a nanostructure medium over a surface of said recess; and annealing said structure thereby to form said nanostructured element in each of said one or more recesses, said nanostructured element comprising a portion of said nanostructure medium, said nanostructured element having an external dimension along at least two substantially orthogonal directions of less than substantially 100 nm.

In a second aspect of the invention there is provided a method of forming a nanoparticle at one or more predetermined locations on a substrate comprising the steps of: forming a mask member over said substrate; forming a window in said mask member at each of one or more locations at which it is required to form said nanoparticle thereby to expose a portion of a surface of said substrate; etching a portion of said substrate exposed by said window at said one or more locations to form one or more recesses in said substrate; forming a layer of a particle medium over a surface of said recess; and annealing said structure thereby to form said nanoparticle in each of said one or more recesses, said nanoparticle comprising a portion of said particle medium.

In a third aspect of the invention there is provided a method of forming a nanowire at one or more predetermined locations on a substrate comprising the steps of: forming a mask member over said substrate; forming an elongate window in said mask member at each of one or more locations at which it is required to form said nanowire thereby to expose a portion of a surface of said substrate; etching a portion of said substrate exposed by said window at said one or more locations to form one or more grooves in said substrate; forming a layer of a wire medium over a surface of said groove; and annealing said structure thereby to form said nanowire in each of said one or more grooves, said nanowire comprising a portion of said particle medium.

Some embodiments of the invention have the feature that a nanostructure may be formed at a predetermined location on a surface of a structure. In some embodiments an array of nanostructures is formed by this method. The method allows ordered arrays of nanostructures such as nanowires and nanoparticles to be fabricated having predetermined spacing and location on a surface of a structure.

DETAILED DESCRIPTION OF THE INVENTION

Figure 1:
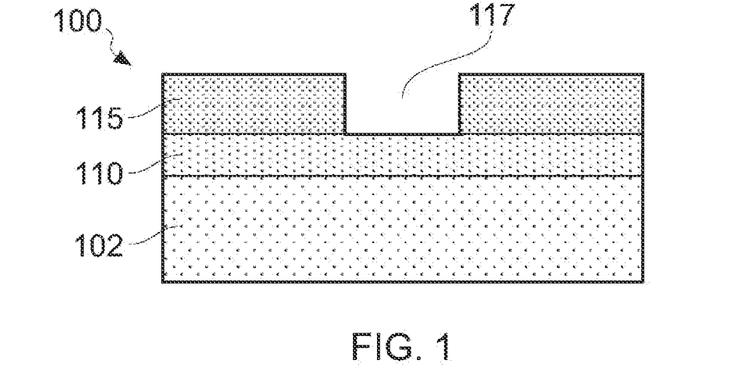
FIGS. 1 to 5 show structures formed during a process of forming an ordered array of nanoparticles on a substrate according to an embodiment of the invention in which a square-base pyramidal recess is formed in the substrate.

FIG. 1 is a cross-sectional schematic illustration of a structure 100 formed during a process of forming an ordered array of nanoparticles according to an embodiment of the present invention. The structure, as shown, comprises a substrate 102. The substrate, in one embodiment, comprises a semiconductor wafer, such as silicon. The substrate, for example, is a p-type (100) substrate. Other types of substrates are also useful.

In one embodiment, a hard mask 110 is provided over the substrate. The hard mask, for example, comprises silicon oxide. In one embodiment, the hard mask is formed by thermal oxidation, such as heating the substrate in an oxygen atmosphere at about 900° C. The thickness of the hard mask is, for example, about 10 nm. Other types of hard mask material, deposition techniques, or thicknesses are also useful.

A sacrificial layer 115 is formed over the hard mask layer. The sacrificial layer serves as a soft mask for patterning the hard mask. In one embodiment, the sacrificial layer comprises photoresist. Various types of photoresist, such as polymethyl methacrylate (PMMA), can be used. The photoresist can be deposited on the substrate by spin-coating. The thickness of the soft mask, for example, is about 100 nm. Other thicknesses of the sacrificial layer are also useful. An antireflective coating (ARC) can be provided beneath the photoresist to improve lithographic resolution.

As shown, the sacrificial layer has been patterned by a lithographic process to form a plurality of windows 117 therein. The windows 117 are formed to expose portions of the layer of hard mask over each location of the substrate 102 at which nanoparticles are formed. For purposes of simplifying the discussion, only one window is shown. The window 117, for example, comprises a square shape. Other window shapes are also useful.

In some embodiments, the windows are around 200 nm wide, but other sizes are also useful. For instance, in some embodiments the windows are from around 50 nm to around 1 micron wide.

Figure 2:
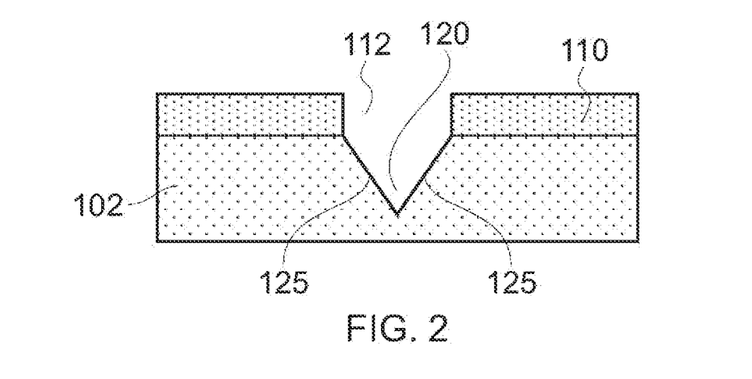

Referring to FIG. 2, the hard mask is patterned, removing portions exposed by the windows of the soft mask to form a plurality of windows 112. The patterned hard mask exposes portions of the substrate 102.

In one embodiment, the hard mask is patterned using an isotropic etch, such as a wet etch. The wet etch can employ a first etch solution having, for example, 0.1 weight percent buffered hydrofluoric acid (HF) in deionised water at room temperature. Other types of etch processes, such as anisotropic etch, including reactive ion etch (RIE), are also useful in patterning the hard mask.

The sacrificial layer 115 is then removed after the hard mask is patterned. In one embodiment, the photoresist layer is removed by a wet etch. In a preferred embodiment, the photoresist layer is removed by exposing it to a second etch solution having, for example, 30 weight percent potassium hydroxide (KOH) in deionised water at about room temperature.

In accordance with one embodiment of the invention, the second etch solution also anisotropically etches the exposed portions of the substrate. In one embodiment, the substrate is patterned to form a recess 120 having walls 125 defining an inverted pyramid shape. The inverted pyramid shape comprises, for example, an inverted square-base pyramid shape. In some embodiments, the walls correspond to crystallographic planes of the substrate. In some embodiments the walls correspond to (111) planes. In some embodiments, walls are provided corresponding to (110) planes. In some embodiments, walls are provided corresponding to (100) planes or any other suitable crystallographic plane.

Other orientations of substrate are also useful in addition to (100) substrates such as (110) and (111) oriented substrates.

Other first etch and/or second etch solutions are also useful, as are recesses having other shapes. Isotropic etch processes are useful in some embodiments of the invention.

Figure 3:
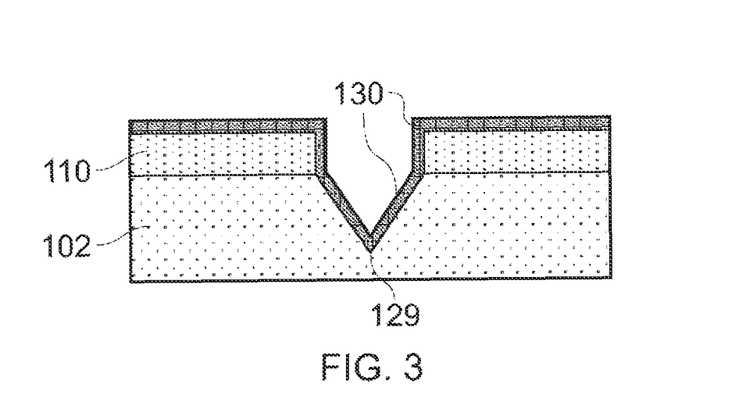

As shown in FIG. 3, a device layer 130 is deposited on the substrate. The device layer lines the surface of the hard mask and the walls of the recess. The device layer, in one embodiment, serves as a particle medium. The device layer, for example, comprises gold (Au) and may have a thickness of about 10 nm. Other types of device layers are also useful. For example, the device layer can include but is not limited to Ni, Al, Co, Ti, other metallic materials, metal alloys, compounds including semiconductor and metallic compounds, or a combination thereof.

Other thicknesses of the layer of particle medium 130 are also useful. For example, in some embodiments the layer of particle medium 130 may be formed to have a thickness in the range of from around 5 nm to around 50 nm. In some embodiments, the layer of particle medium 130 may be a discontinuous layer rather than a continuous layer, for example, only lining the walls or the recess.

The layer of particle medium 130 may be formed by physical vapour deposition at a pressure of around $1 \times 10^{-6}$ Torr but other pressures are also useful. Other methods of deposition are also useful such as chemical vapour deposition or electroplating.

Figure 4:
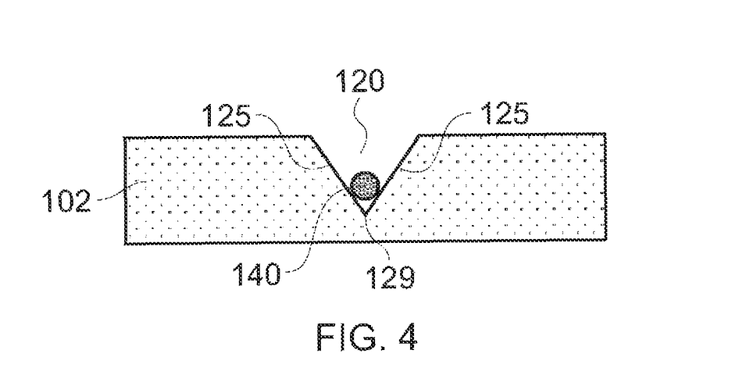

FIG. 4 shows the structure of FIG. 3 following a process of annealing the structure to cause agglomeration (or 'breaking up') of the generally continuous layer of particle medium 130. Annealing of the structure may be performed in a nitrogen ambient atmosphere at a temperature of from around 600° C. to around 1000° C. During the process of annealing, the layer of particle medium 130 breaks up due to surface tension whereby nanoparticles of particle medium 130 are formed.

In the embodiment of FIG. 4 it can be seen that a particle 140 has been formed at an intersection 129 of four walls 125 defining the recess 120 in the substrate 102. The intersection 129 of the structure of FIG. 4 is coincident with an apex of the square-base pyramid shape defined by the walls 125.

Following the annealing process, remaining portions of the layer of mask medium 110 may be removed by exposure of the substrate to a solution having 10 weight percent buffered hydrofluoric acid (HF) in deionised water at room temperature. In some embodiments, the layer of mask medium 110 may be removed before annealing the structure.

Figure 5:
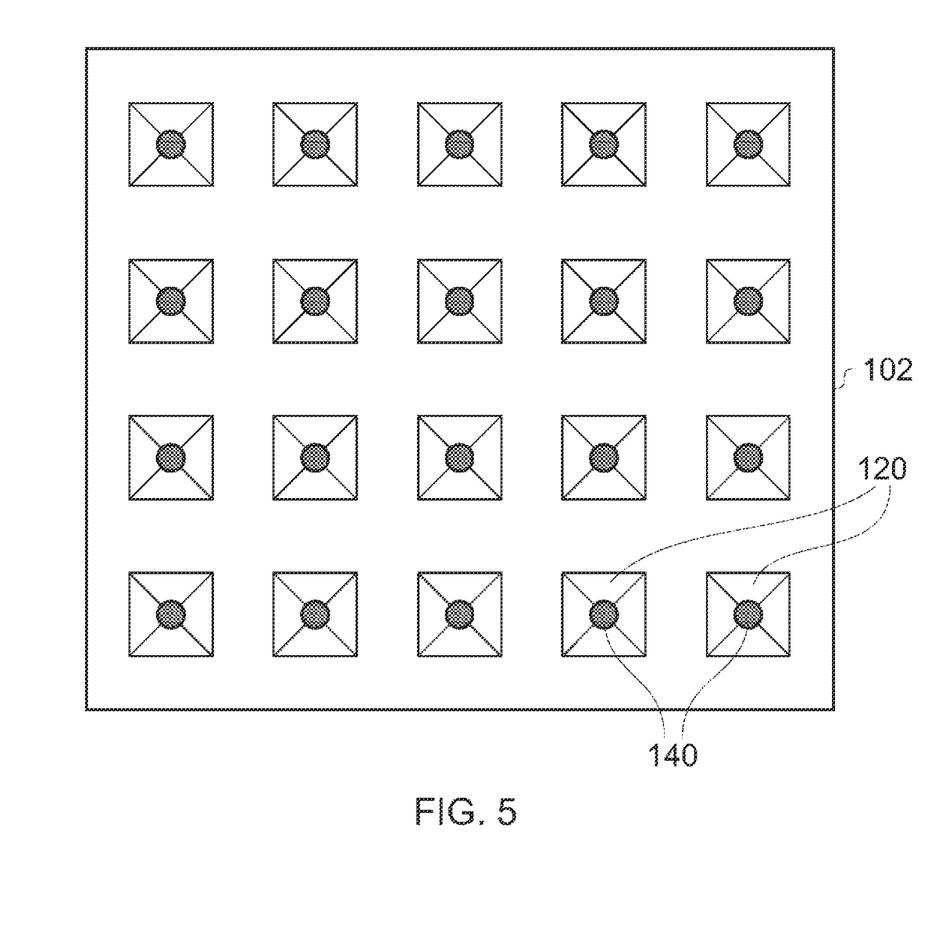

FIG. 5 shows the structure of FIG. 4 in plan view. As shown, an ordered array of recesses in the form of four rows of five columns of recesses 120 each with walls 125 defining a pyramidal shape have been formed, but other forms of array may be used instead. Other sizes of array are also useful. In some embodiments of the invention disordered arrays of recesses may be formed.

Figure 6:
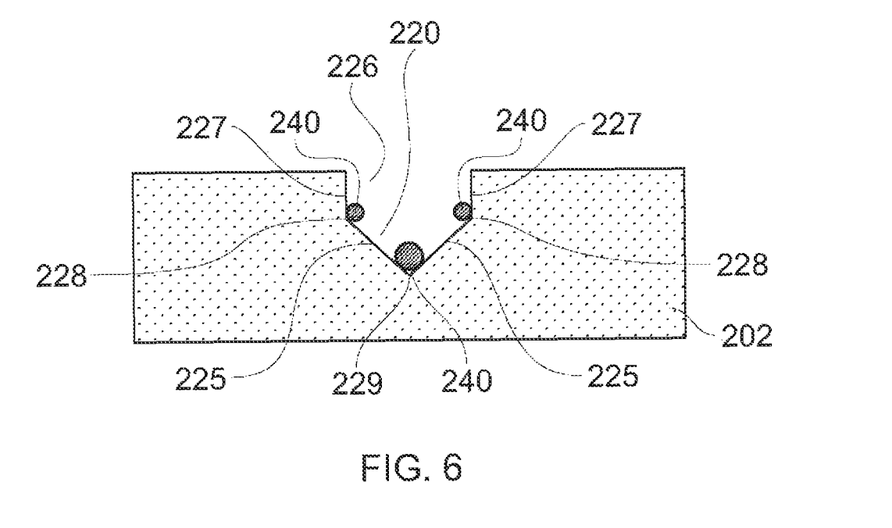
FIGS. 6 and 7 show structures in which a square-base pyramidal recess is formed in a substrate at the end of a passageway extending into the substrate generally perpendicular to a surface of the substrate.

FIG. 6 shows a structure having a substrate 202 in which a recess 220 has been formed. The recess 220 has non-parallel walls 225 defining a pyramidal shape similar to that of the structure of FIG. 4 and FIG. 5, with the additional feature that the walls 225 are provided at one end of a channel 226 defined by a set of four generally parallel walls 227. In other words, the recess 220 is itself recessed below a surface of the substrate.

The channel 226 of the embodiment of FIG. 6 is substantially square in cross-section. However, other cross-sectional shapes are also useful. In some embodiments, the channel may be substantially rectangular in cross-section, the recess 220 having a roof-shaped portion.

The length of the channel 226 (and hence the depth at which the non-parallel walls 225 are formed) may be varied according to the requirements of a particular application.

As can be seen from FIG. 6, a plurality of intersections 228, 229 between two or more non-coplanar surfaces at angles to one another of less than 180° are present. For example, four intersections 228 of walls are present between respective adjacent walls 227 of the channel 226 and walls 225 of the recess 220. In some embodiments, these intersections 228 provide preferential nucleation locations for the formation of nanoparticles 240 of particle medium 130. Similarly, a single intersection 229 between walls 225 of the recess 220 provides a preferential nucleation site for the formation of nanoparticles 240 in some embodiments of the invention.

In some embodiments of the invention, preferential nucleation occurs at the intersections 228, 229 because a reduction in overall free energy of the structure can be obtained. This is at least in part due to a reduction in surface tension that is obtained by certain particles when an increased area of contact between a particle and one or more walls of the structure occurs.

In some embodiments, a reduction in surface tension is obtained when a size of an area of contact between a particle and a wall of the structure is reduced. Consequently, in some embodiments of the invention particles form preferentially away from intersections 228, 229.

Figure 7:
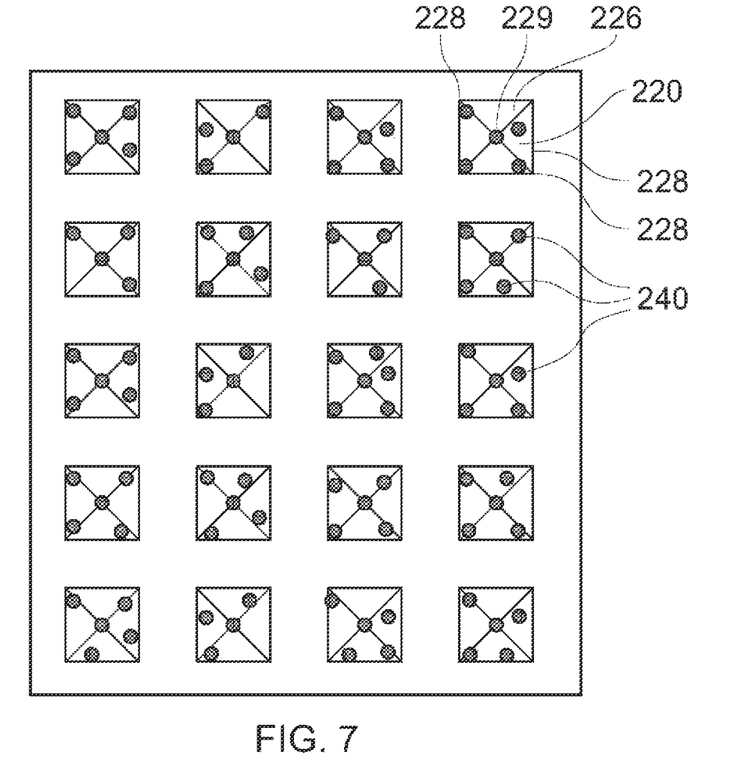

FIG. 7 is a plan view of the structure of FIG. 6 showing an array of recesses 220 formed in the substrate 202. A plurality of nanoparticles 240 can be seen within each of the recesses 220 at locations corresponding to the intersections 228, 229 described above. As can be seen, nanoparticles 240 may form at the intersections 228 or away from the intersections 228.

Figure 8:
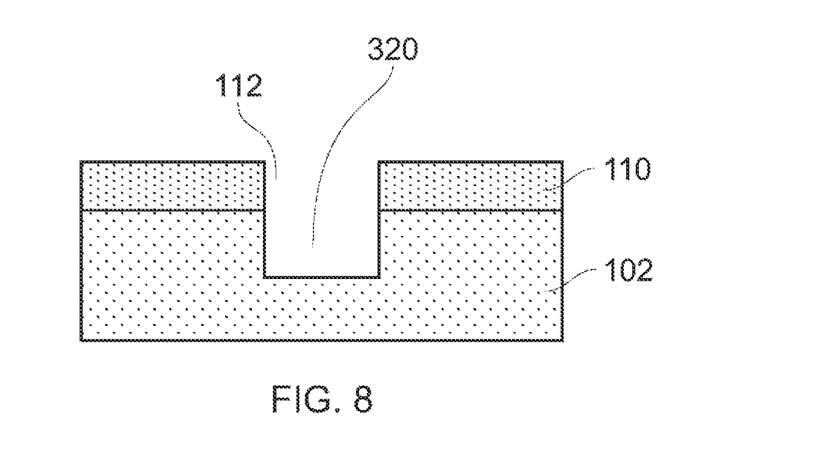
FIGS. 8 to 10 show structures formed during a process of forming an ordered array of nanoparticles on a substrate according to an embodiment of the invention in which a recess is formed having a generally cubic or cuboid shape.

FIG. 8 shows an alternative structure to that of FIG. 2 following a process of etching the structure of FIG. 1 to form a recess 320 having the shape of a cuboid rather than the square-base pyramid of FIG. 2. In the embodiment of FIG. 8 the structure was formed by a reactive ion etching (RIE) process.

By cuboid it is meant a generally rectangular parallelepiped.

Figure 9:
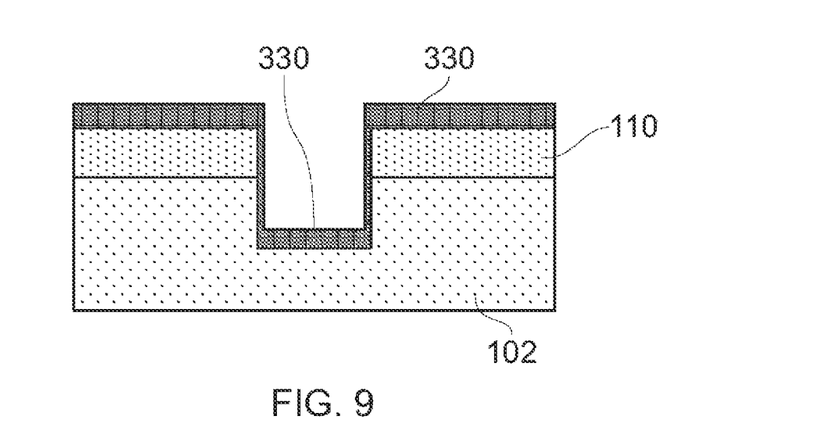

FIG. 9 shows the structure of FIG. 8 following a process of forming a layer of a particle medium 330 over the structure. In the embodiment of FIG. 9, the particle medium may be gold (Au) and the layer may be formed by thermal evaporation, but other methods of depositing the particle medium 330 are useful. Other materials are also useful such as those described above with respect to the embodiment of FIGS. 1 to 7.

It can be seen from FIG. 9 that the layer of particle medium 330 forms primarily over lateral surfaces of the structure, i.e. over surfaces generally parallel to a plane of the substrate 102.

Figure 10:
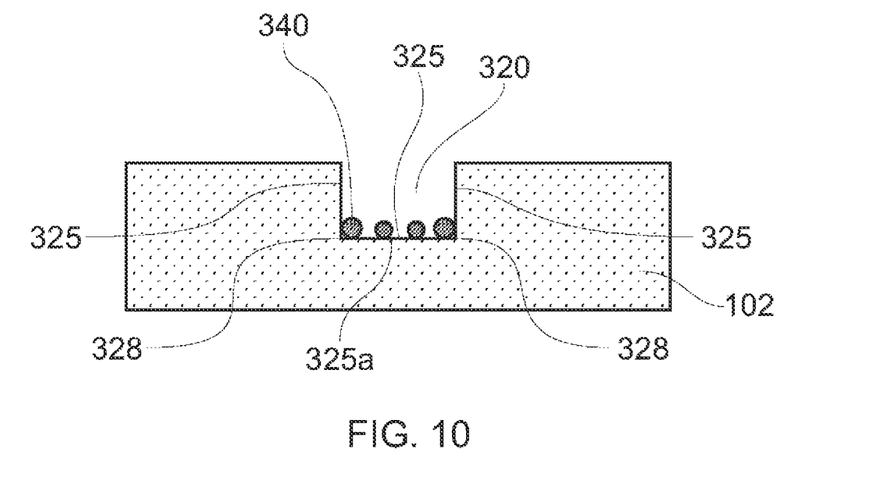

FIG. 10 shows the structure of FIG. 9 following a process of annealing the structure to cause agglomeration of the layer of particle medium 330 to form a plurality of nanoparticles 340. In the embodiment of FIG. 9, it can be seen that nanoparticles 340 have nucleated at non-coplanar intersections of surfaces, such as at intersections 328 of basal wall 325a and sidewalls 325.

Nanoparticles have also nucleated at locations of a basal wall 325a distal any such intersections 328. In other words, nanoparticles 340 have also nucleated at locations of a wall 325a of a recess 320 away from any intersection 328 of said wall 325a with sidewalls 325 of the recess 320.

Figure 11:
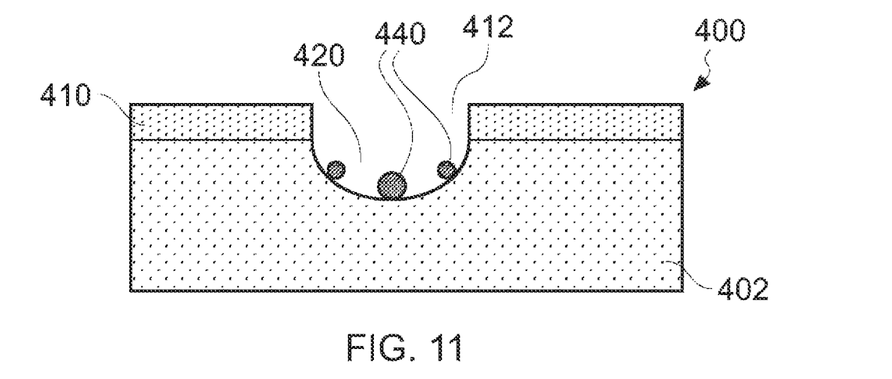
FIGS. 11 and 12 show structures according to an embodiment of the invention having a generally hemispherical recess formed in a surface of a substrate.

FIG. 11 is a cross-sectional view of a structure 400 formed by a method according to an embodiment of the invention. In the embodiment of FIG. 11, a mask medium 410 has been formed over a substrate 402 and an ordered array of windows 412 formed in the mask medium 410. Windows 412 have been formed in the mask medium 410 to expose a portion of the surface of the substrate 402.

The structure has then been exposed to an etch process to form a recess 420 having a rounded concave shape, for example corresponding to a portion of a sphere. In the structure of FIG. 11 the recess is formed by an isotropic wet etch process. Other etch processes are also useful.

Nanoparticles 440 have been formed in the recess by annealing a layer of a particle medium formed over the structure in a similar manner to that described with respect to other embodiments of the invention.

Figure 12:
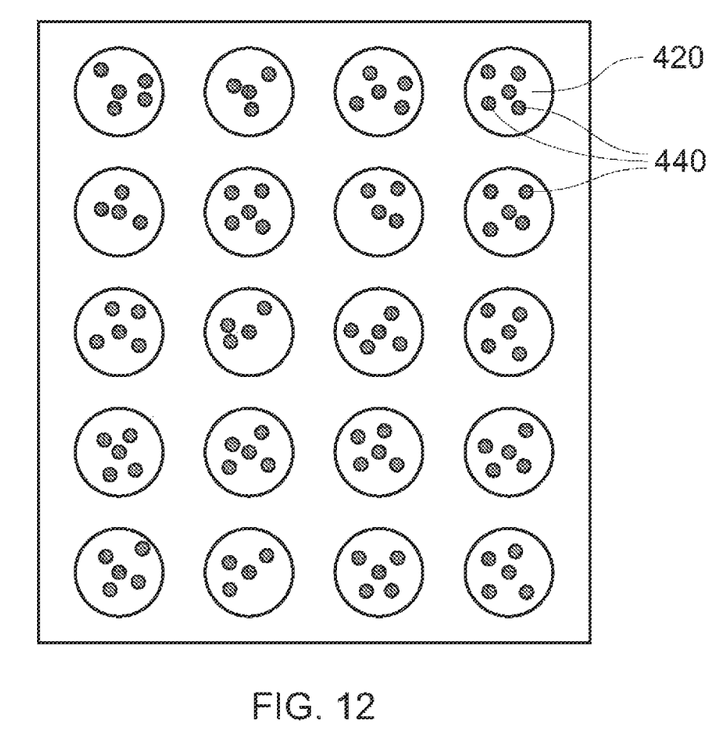

FIG. 12 is a plan view of the structure of FIG. 11 following removal of remaining portions of the mask medium 410.

While the figures have shown, for example, pyramidal, cuboid and spherical recesses, other shapes of recess are also useful. In some embodiments, some recesses may be formed to overlap one another at least partially.

Figure 13:
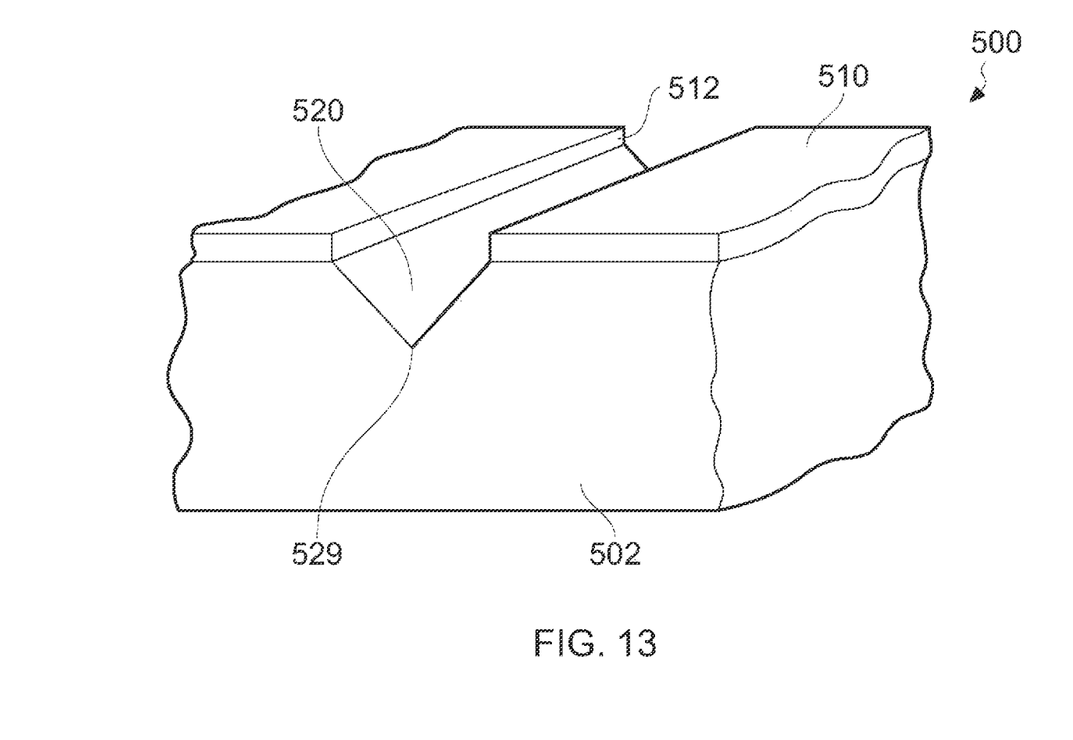
FIGS. 13 and 14 show structures formed according to an embodiment of the invention during a process of forming an ordered array of nanowires on a substrate.

FIG. 13 shows a structure 500 formed during a process of forming a nanowire or a linear arrangement of a plurality of nanoparticles according to an embodiment of the invention. The structure has a substrate 502 in which a groove 520 having a v-shape cross-section has been formed. Although the groove is described as having a v-shape cross-section, it is to be understood that an apex of the groove may be rounded rather than angular. Furthermore, other cross-sectional shapes of groove are also useful.

The groove 520 is formed by opening an elongate window 512 in a mask member 510 formed over the substrate 502 to expose a portion of a surface of the substrate 502. The mask member 510 and the window 512 in the mask member 510 may be formed in a similar manner to the mask members and windows described above with respect to other embodiments of the invention.

Once the window 512 has been formed, etching of the exposed portion of the substrate is performed by exposing the substrate to an anisotropic etch process. In the embodiment of FIG. 13 the anisotropic etch process involves exposure of the substrate to an etch solution having, for example, 30 weight percent potassium hydroxide (KOH) in deionised water.

Figure 14:
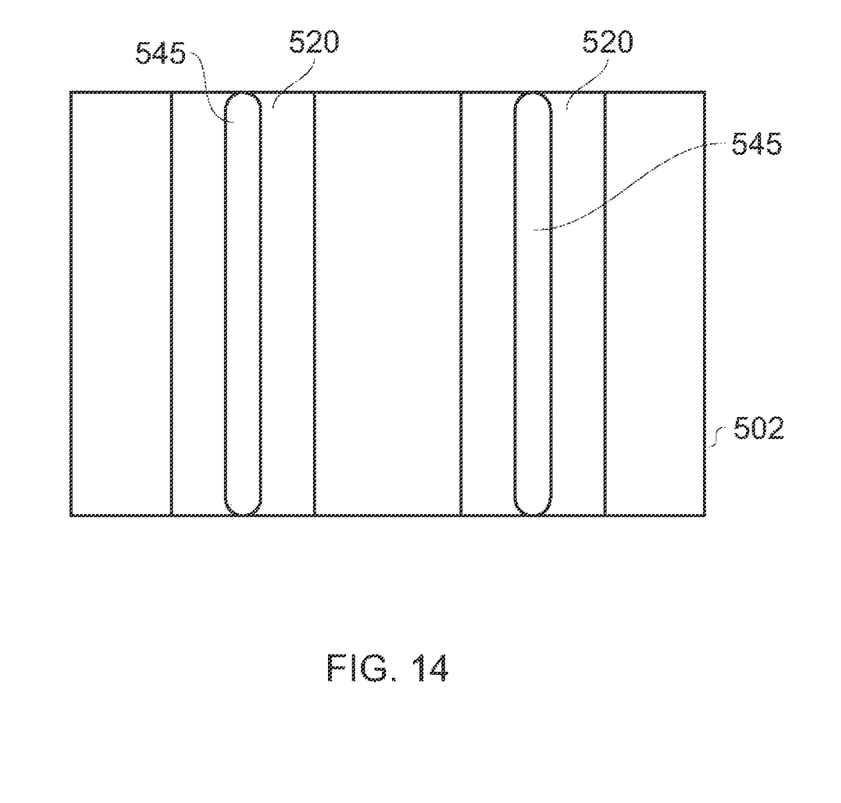

A layer of a nanostructure medium may then be formed over the structure and the structure annealed to cause agglomeration of the layer of nanostructure medium. FIG. 14 shows a structure following annealing of the nanostructure medium whereby nanowires 545 are formed along an apex 529 of each groove 520.

For the present purposes, by nanowire is meant a discrete element having a dimension along each of two orthogonal directions that is generally less than or equal to around 100 nm. In some embodiments, nanowires are formed having dimensions along two generally orthogonal (x, y) directions of less than around 50 nm. In some embodiments, nanowires are formed having corresponding dimensions of less than around 10 nm. A nanowire may have a length along a third direction (z) mutually orthogonal to the (x, y) directions of at least 150 nm. In some embodiments, the length of the wire is at least 1 micron.

In the embodiment of FIG. 13, Au may be used as the wire medium whereby nanowires of Au may be formed. Other wire media are also useful including metallic materials, metal alloys, and compounds including semiconductor and metallic compounds.

In some embodiments, annealing conditions similar to those described above with respect to particle media are used to form nanowires. It will be appreciated that the size of the nanowires may be controlled at least to some extent by control of the size and shape of the v-shaped groove 320, the thickness of the layer of wire medium, the annealing time, annealing temperature and ambient conditions during annealing including gaseous background pressure and composition of background gas.

Nanowires formed according to some embodiments of the invention may be subsequently reacted with one or more further materials in order to form a required nanowire material. In some embodiments, the nanowires may be caused to react with the substrate in order to form a required nanowire material.

Figure 15:
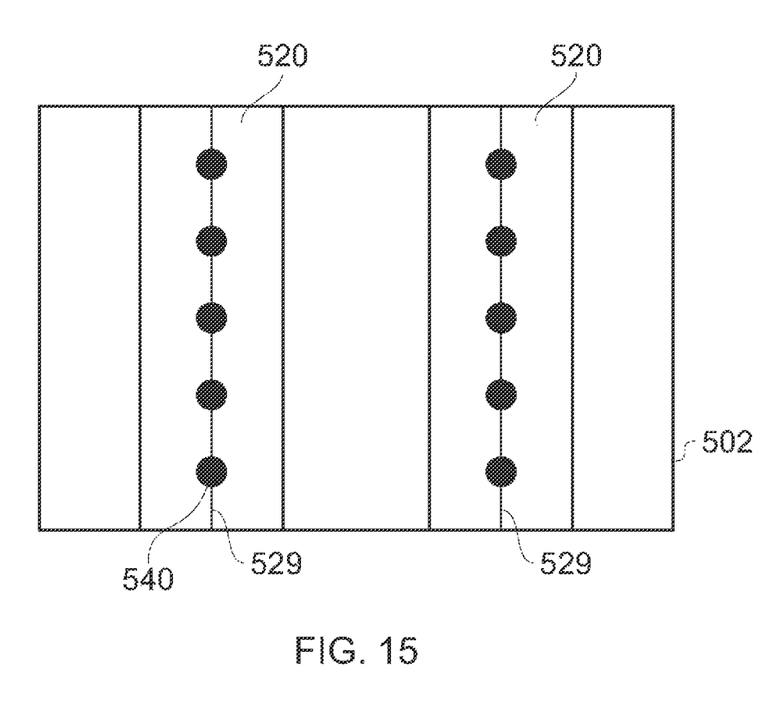
FIG. 15 shows a structure formed according to an embodiment of the invention having a plurality of nanoparticles formed along an apex of a groove formed in a substrate.

FIG. 15 shows a structure formed upon annealing the layer of nanostructure medium formed over the structure of FIG. 13 to form a plurality of nanoparticles 540 along an apex 529 of the groove 520, rather than a nanowire 545 (as shown in FIG. 14). In other words, a row of discrete nanoparticles is formed along the apex of the groove 520.

Other shapes of the groove 520 are useful including curved grooves (e.g. in the form of a portion of a cylindrical or other concave rounded surface), generally cuboid grooves or any other suitable shape.

Multiple grooves may be formed immediately adjacent one another. In some embodiments of the invention a serrated groove structure is formed. By the term serrated is included a structure in which a plurality of grooves are formed in parallel with one another, the plurality of grooves together having a generally saw-tooth shaped cross-section.

It will be appreciated that in some embodiments of the invention the layer of particle medium or wire medium is initially formed to be discontinuous and not continuous. In some embodiments, the layer may be subsequently annealed to form a plurality of nanoparticles or nanowires. For example, in the case of embodiments in which nanowires are formed, a plurality of discontinuous nanowires may be formed in any one groove 520.

In some embodiments of the invention in which one or more nanoparticles are formed at a predetermined location on a substrate the one or more nanoparticles may be subsequently used to form a further nanostructure such as a nanowire or a nanotube.

For example, in some embodiments the nanowire or nanotube so formed is used as a 'seed' nanostructure to catalyse the formation of a further nanostructure such as a nanowire or nanotube by vapour-liquid-solid (VLS) growth or any other suitable growth technique.

For example, the nanowire or nanotube may be heated to form a further nanowire, nanoparticle and/or other nanostructure and/or by reaction with the substrate or with a gaseous medium.

In some embodiments, an Au nanoparticle on a silicon substrate is heated to a temperature of around 530° C. in a flowing silane ($SiH_4$) atmosphere in order to form a silicon nanowire by vapor-liquid-solid (VLS) growth. For details of VLS growth, see for example R. S. Wagner and W. C. Ellis, Appl. Phys. Lett., 4, page 89, 1964.

In some embodiments, the silicon nanowire is formed by exposing the structure to a flow of a gas comprising 5% silane ($SiH_4$) diluted in $H_2$ gas at a pressure of 850 mTorr and a flow rate of 400 sccm for 10 minutes. The structure is held at a temperature of 530° C. during exposure to the flow of gas.

In other embodiments the nanostructure is heated in the presence of a vapour to form a further nanostructure such as a nanocage (e.g. around an existing nanoparticle) or a nanotube (e.g. nucleated/catalysed by an existing nanoparticle). In some embodiments the structure may be exposed to a vapour bearing at least one selected from amongst a Group II element, a Group III element, a Group IV element, a Group V element and a Group VI element of the periodic table. In some embodiments the structure is heated in the presence of a vapour comprising at least one selected from amongst a carbon-bearing vapor, a nitrogen-bearing vapor and a boron-bearing vapor. For example, exposure of a nanoparticle of Co or other particle material to a carbon-bearing vapour can result in the formation of a carbon nanotube. If the size of the nanoparticle is sufficiently small (e.g. in the range of from around 1 nm to around 10 nm, preferably around 2 nm to around 5 nm) a single-walled nanotube may be formed In yet other embodiments, a seed nanoparticle formed according to embodiments of the invention is heated in the presence of a vapour bearing nitrogen and boron (e.g. borazine) to form a boron nitride nanostructure such as a boron nitride nanocage and/or a boron nitride nanowire and/or a boron nitride nanotube. In some embodiments, a seed nanowire formed according to an embodiment of the invention is heated to form a boron nitride nanostructure. In some embodiments, the nanostructure so formed is a nanowire.

One or more nanocages may also be formed around other nanoparticles formed according to one or more embodiments of the invention in order to form further nanostructured materials.

Reference to a 'nanoparticle' herein is intended to include reference to a particle having dimensions along each three mutually orthogonal (x, y, z) axes not exceeding substantially 100 nm.

Reference to a 'discrete' element is intended to mean reference to an element that is not intimately bound to a matrix comprising the same material as which the element is composed. Thus, reference to a discrete nanostructured element would not include reference to a grain of a generally continuous thin film having a grain size of 100 nm or less.

It will be appreciated that grooves may be formed in a structure such as a substrate, the grooves having bends, kinks, jogs and/or other locations at which a longitudinal axis of the groove changes its orientation relative to other portions of the groove.

It will be appreciated that grooves and other formations may be formed at different depths of the structure and that connections between nanowires formed at different depths can be contemplated. In some embodiments of the invention grooves may be formed at an angle to the plane of the surface whereby nanowires may be formed that do not lie in a plane parallel to the plane of the substrate surface. Thus in some embodiments of the invention nanowires may be formed that connect elements provided at different depths of a structure.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of forming a discrete nanostructured element at one or more predetermined locations on a substrate comprising:
   forming a mask member over said substrate;
   forming a window in said mask member to expose a portion of a surface of said substrate at each of the one or more locations where said nanostructured element is to be formed;
   removing a portion of said substrate exposed by said window at said one or more locations to form one or more recesses in said substrate;
   forming a layer of a nanostructure medium over a surface of said recess and the mask member; and
   annealing the layer of the nanostructure medium to form said nanostructured element in each of said one or more recesses, said nanostructured element comprising a portion of said nanostructure medium, said nanostructured element having an external dimension along at least two substantially orthogonal directions less than or substantially equal to 100 nm; and
   removing the mask member after annealing the layer of the nanostructure medium.

2. A method as claimed in claim 1 wherein the step of forming said one or more recesses comprises the step of etching said structure.

3. A method as claimed in claim 1 wherein the step of forming a recess in said substrate comprises forming a recess having one or more walls defining a base shape corresponding to at least one selected from amongst a portion of a pyramidal structure, a portion of a square-base pyramidal structure, a portion of a cube, a portion of a cuboid, a concave rounded surface, a portion of a surface of a sphere, a portion of a surface of a cylinder and a groove of substantially v-shaped or u-shaped cross-section.

4. A method as claimed in claim 3 wherein at least one of said walls of said base shape is generally defined by a crystal plane of said substrate.

5. A method as claimed in claim 3 wherein said recess comprises a passageway having said base shape provided at a first end of said passageway, a second end of the passageway opposite said first end having an opening at said surface of said substrate.

6. A method as claimed in claim 5 wherein said passageway has bends, kinks, jogs and/or other locations at which a longitudinal axis of said passageway changes its orientation relative to other portions of the passageway.

7. A method as claimed in claim 1 wherein the nanostructured element comprises a nanoparticle.

8. A method as claimed in claim 1 wherein said recess comprises an elongate groove.

9. A method as claimed in claim 8 wherein said groove has a portion having a substantially v-shaped or u-shaped cross-section, said nanostructured elements being provided along an apex of said v-shaped or u-shaped portion of said groove.

10. A method as claimed in claim 8 wherein the nanostructured element comprises a nanowire.

11. A method as claimed in claim 1 wherein said mask member comprises silicon oxide.

12. A method as claimed in claim 1 wherein said nanostructure medium comprises a catalyst material.

13. A method as claimed in claim 1 wherein the nanostructured element is formed at an intersection of non-parallel walls of the recesses.

14. A method as claimed in claim 1 wherein said nanostructure medium comprises at least one selected from amongst Au, Ni, Al, Co and Ti.

15. A method as claimed in claim 1 further comprising the step of heating said nanostructure thereby to form a further nanostructure.

16. A method as claimed in claim 15 wherein the step of heating said nanostructure comprises the step of heating said nanostructure in the presence of a vapor.

17. A method as claimed in claim 16 wherein said vapour comprises a vapor bearing at least one selected from amongst a Group II element, a Group III element, a Group IV element, a Group V element and a Group VI element of the periodic table.

18. A method as claimed in claim 17 wherein said vapor comprises at least one selected from amongst a carbon-bearing vapor, a nitrogen-bearing vapor and a boron-bearing vapor.

19. A method as claimed in claim 1 wherein the step of forming the nanostructure medium comprises the step of forming a generally continuous layer of said medium.

20. A method as claimed in claim 1 wherein the step of forming the layer of the nanostructure medium comprises lining the surface of the mask member and walls of the recesses without filling the recesses.

21. A method of forming a device comprising:
providing a substrate prepared with a recess, wherein the substrate comprises a mask member over a top surface of the substrate, and the mask member comprises a window which exposes the recess, wherein the window is formed by mask and etch processes;
lining a top surface of the mask member and walls of the recess with a layer of a nanostructure medium without filling the recess;
annealing the layer of the nanostructure medium to form a nanostructure in the recess wherein the nanostructure comprising a portion of the nanostructure medium; and
removing the mask member after annealing the layer of the nanostructure medium.

22. The method of claim 21 wherein the nanostructure is formed at an intersection of non-parallel walls of the recesses.

23. A method of forming a nanowire at one or more predetermined locations on a substrate comprising the steps of:
forming a mask member over said substrate;
forming an elongate window in said mask member to expose a portion of a surface of said substrate at each of the one or more locations where said nanowire is to be formed;
etching a portion of said substrate exposed by said window at said one or more locations to form one or more grooves in said substrate;
forming a layer of a wire medium over a surface of said groove; and
annealing the layer of the wire medium thereby to form said nanowire in each of said one or more grooves along a bottom area of each of the grooves, said nanowire comprising a portion of said wire medium.

24. A method as claimed in claim 23 wherein said groove comprises a portion having a substantially v-shaped or u-shaped cross-section, said nanowire being formed along an apex of said portion of said groove.

* * * * *